US012490453B2

(12) United States Patent
Lin et al.

(10) Patent No.: US 12,490,453 B2
(45) Date of Patent: Dec. 2, 2025

(54) HETEROSTRUCTURE CHANNEL LAYER FOR SEMICONDUCTOR DEVICES

(71) Applicant: Taiwan Semiconductor Manufacturing Company, Ltd., Hsinchu (TW)

(72) Inventors: Wen-Yi Lin, Tainan (TW); Shi-Sheng Hu, Tainan (TW); Chao-Chi Chen, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 607 days.

(21) Appl. No.: 17/805,604

(22) Filed: Jun. 6, 2022

(65) Prior Publication Data

US 2023/0395720 A1 Dec. 7, 2023

(51) Int. Cl.
*H10D 30/62* (2025.01)
*H10D 30/69* (2025.01)
*H10D 62/822* (2025.01)

(52) U.S. Cl.
CPC .......... *H10D 30/62* (2025.01); *H10D 30/751* (2025.01); *H10D 62/822* (2025.01)

(58) Field of Classification Search
CPC .... H10D 30/62; H10D 30/751; H10D 62/822; H10D 30/024; H10D 84/0128; H10D 84/0158; H10D 84/038; H10D 84/834
See application file for complete search history.

(56) References Cited

U.S. PATENT DOCUMENTS

| | | | |
|---|---|---|---|
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |

(Continued)

FOREIGN PATENT DOCUMENTS

TW 201721759 A 6/2017

*Primary Examiner* — Steven B Gauthier
*Assistant Examiner* — Alvin L Lee
(74) *Attorney, Agent, or Firm* — Sterne, Kessler, Goldstein & Fox P.L.L.C.

(57) ABSTRACT

The present disclosure describes a semiconductor structure having a heterostructure channel layer. The semiconductor structure includes a substrate and a fin structure on the substrate. The fin structure includes a channel layer and a bottom layer between the channel layer and the substrate. The channel layer includes first, second, and third portions on top of the bottom layer. The first and third portions include the same material as the bottom layer. The second portion includes a material different from the bottom layer. The semiconductor structure further includes first and second source/drain structures on the bottom layer and adjacent to the channel layer. The first source/drain structure is in contact with the first portion of the channel layer. The second source/drain structure is in contact with the third portion of the channel layer.

20 Claims, 16 Drawing Sheets

(56) References Cited

U.S. PATENT DOCUMENTS

| | | | |
|---|---|---|---|
| 10,411,007 B2 | 9/2019 | Dewey et al. | |
| 2014/0299936 A1* | 10/2014 | Zhang | H10D 84/853 |
| | | | 438/157 |
| 2015/0228782 A1* | 8/2015 | Lin | H10D 62/822 |
| | | | 257/192 |
| 2017/0162453 A1 | 6/2017 | Pillarisetty et al. | |
| 2020/0066843 A1* | 2/2020 | Ma | H10D 62/824 |

* cited by examiner

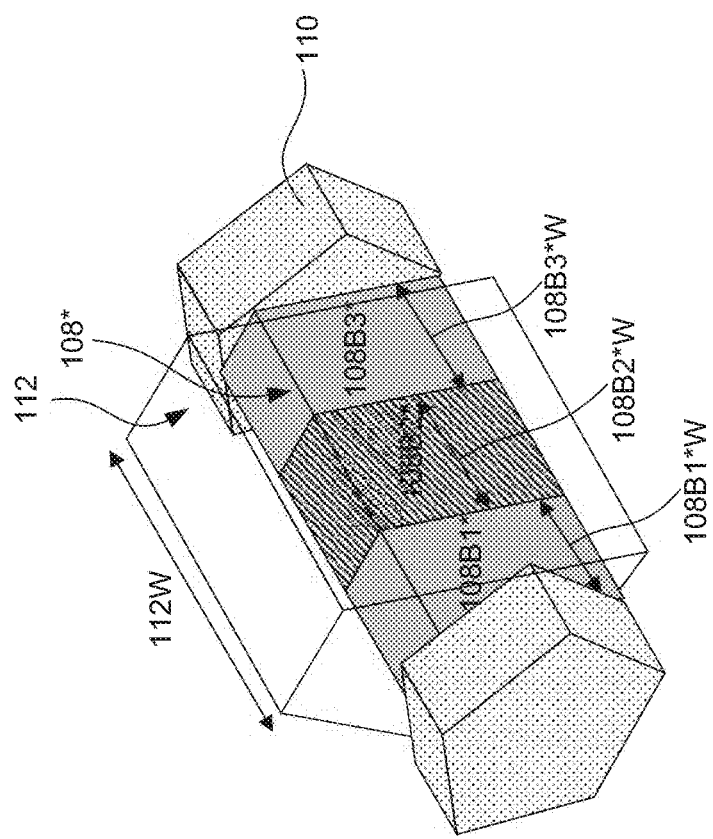
Fig. 4
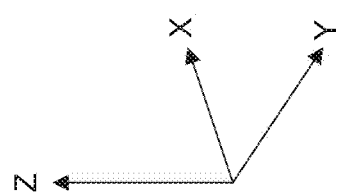

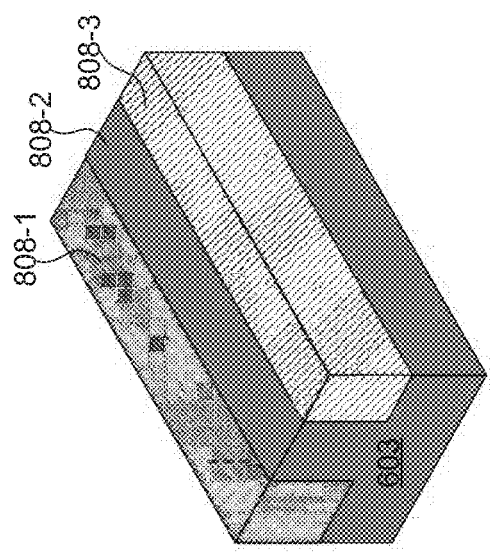
Fig. 16
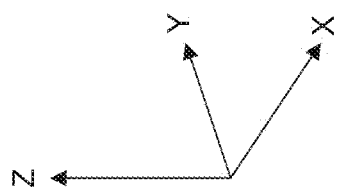

HETEROSTRUCTURE CHANNEL LAYER FOR SEMICONDUCTOR DEVICES

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the off-state leakage current of the semiconductor devices.

BRIEF DESCRIPTION OF THE DRAWINGS

Aspects of the present disclosure are best understood from the following detailed description when read with the accompanying figures.

FIG. 4 illustrates an isometric view of another heterostructure channel layer, in accordance with some embodiments.

FIGS. 13-16 illustrate isometric views of a semiconductor device having another heterostructure channel layer at various stages of its fabrication, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1:
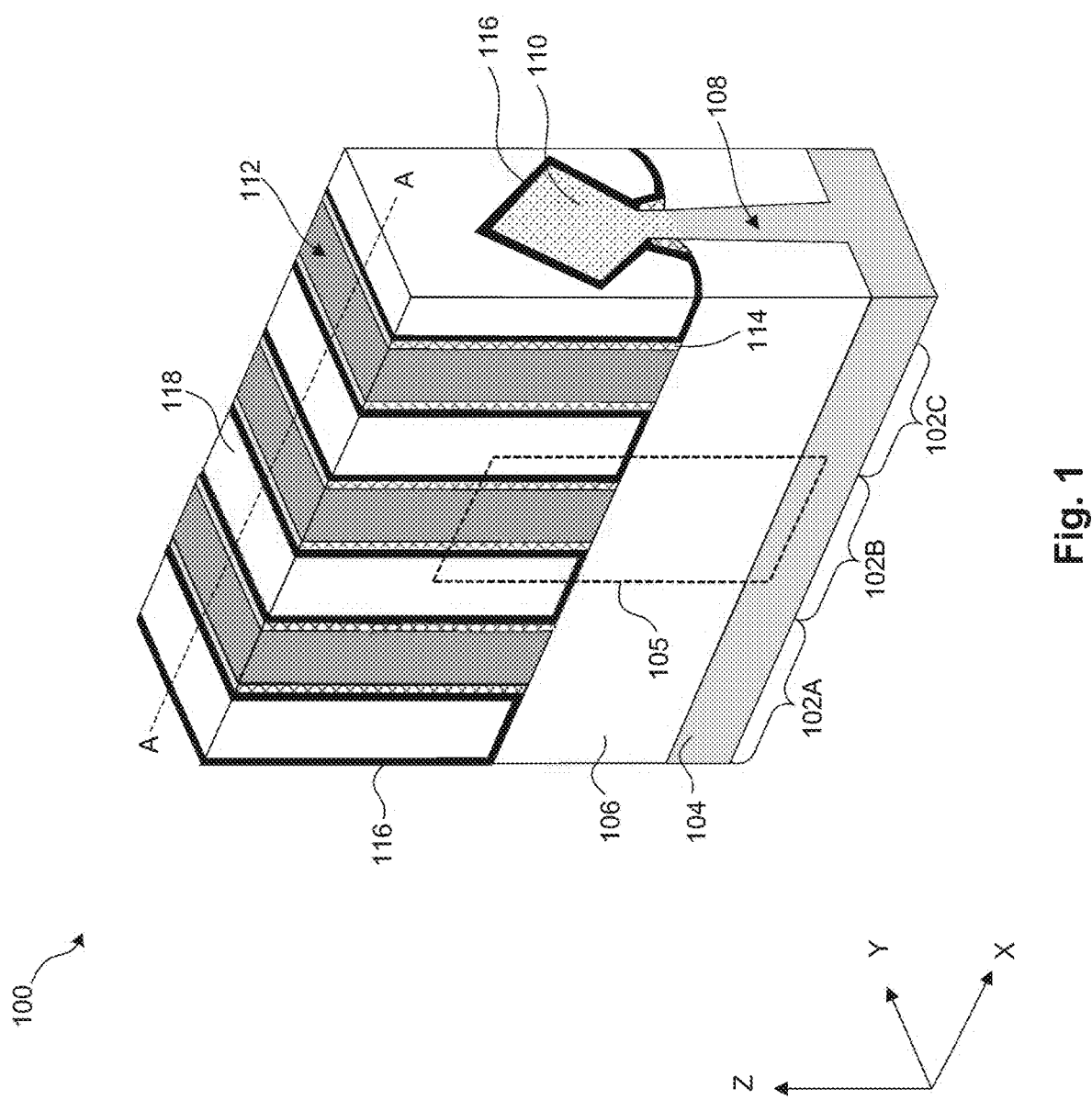
FIG. 1 illustrates an isometric view of a semiconductor device having a heterostructure channel layer, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 20% of the value (e.g., ±1%±2%, ±3%, ±4%, ±5%, ±10%, ±20 of the value). These values are merely examples and are not intended to be limiting. The terms "about" and "substantially" can refer to a percentage of the values as interpreted by those skilled in relevant art(s) in light of the teachings herein.

With increasing demand for lower power consumption, higher performance, and smaller area (collectively referred to as "PPA") of semiconductor devices, the continuous development of semiconductor devices faces multiple challenges. For example, semiconductor devices can have an off-state leakage current through the channel of the semiconductor devices under the gate structure. The off-state leakage current can increase with the scaling down of the dimensions of the semiconductor devices, Additionally, the off-state leakage current can be modulated by the barrier height in the channel between the source and drain regions of the semiconductor devices. Higher off-state leakage current can degrade the device performance and increase power consumption of the semiconductor devices.

Various embodiments of the present disclosure provide example methods for forming a heterostructure channel layer in field effect transistors (FET) devices (e.g., planar FETs, finFETs, GAA FETs, and MOSFETs) and/or other semiconductor devices in an integrated circuit (IC). The example methods in the present disclosure can form one or more heterojunctions in the channel layer of the FET devices. The one or more heterojunctions in the channel layer can increase the barrier height between the source and drain regions of the FET devices and reduce the off-state leakage current of the FET devices. In some embodiments, one or more portions of the channel layer can be doped with a dopant to form the heterojunctions. In some embodiments, one or more portions of the channel layer can be removed and deposited with a material different from the channel layer to form the heterojunctions. In some embodiments, one or more portions of the channel layer can be removed and deposited with a material different from the channel layer and doped with a dopant to form the heterojunctions. In some embodiments, the dopant concentrations in the one or more portions can be different from each other to further reduce the off-state leakage current. In some embodiments, a barrier height of the one or more heterojunctions can range from about 0.1 eV to about 1 eV to reduce the off-state leakage current by about one to about four orders of magnitude.

Figure 2:
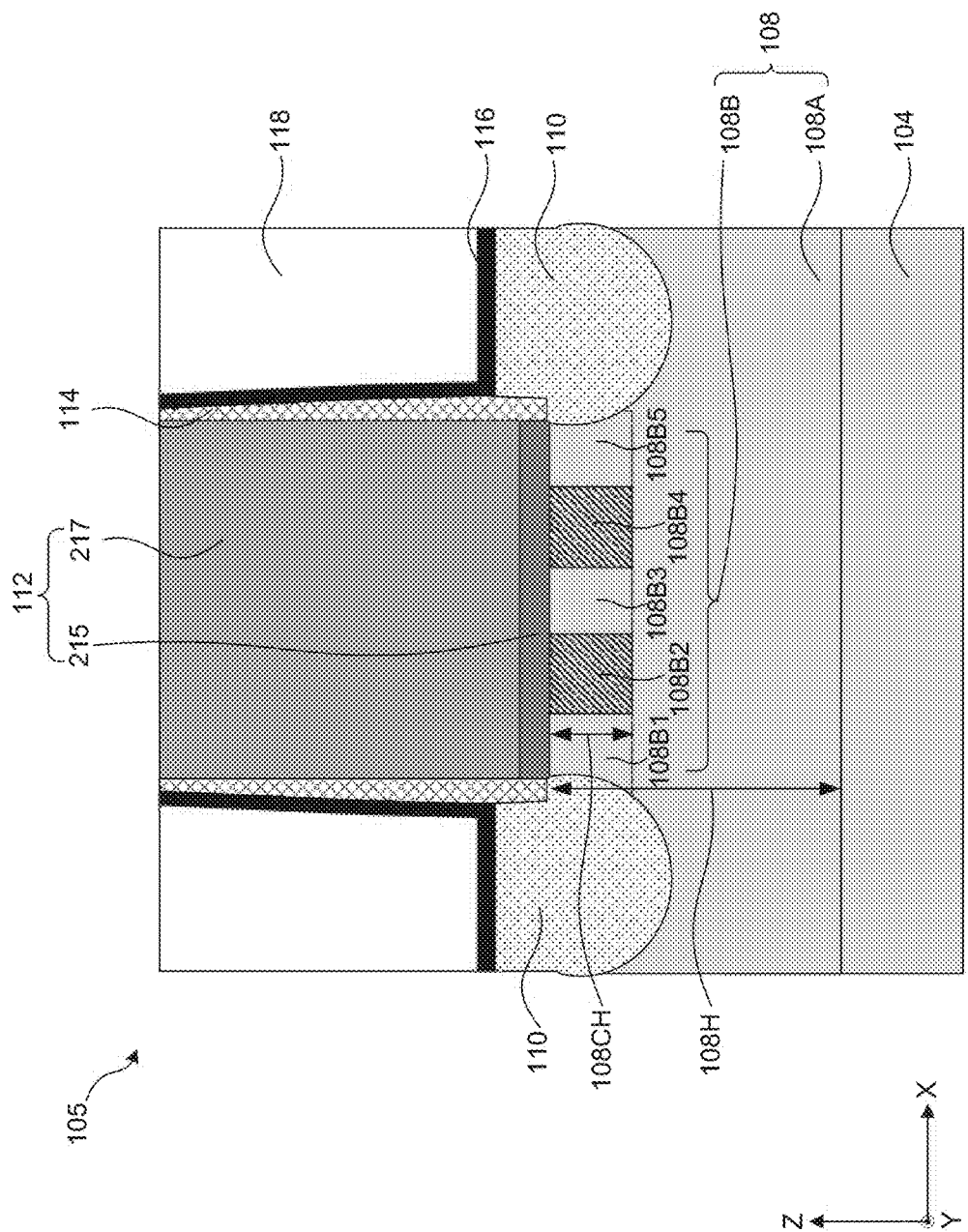
FIG. 2 illustrates a partial cross-sectional view of a semiconductor device having a heterostructure channel layer, in accordance with some embodiments.
Figure 3:
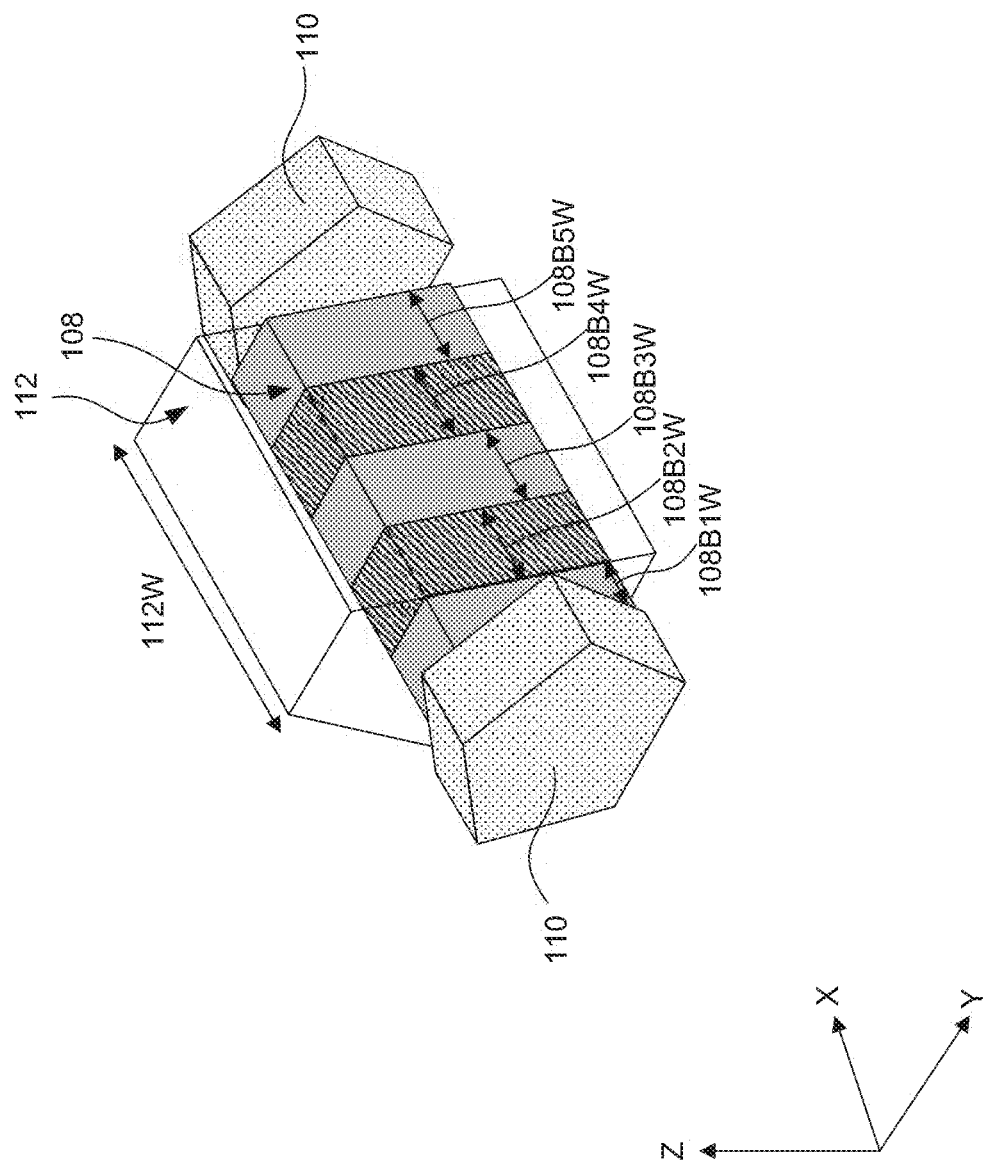
FIG. 3 illustrates an isometric view of a heterostructure channel layer, in accordance with some embodiments.

FIG. 1 illustrates an isometric view of a semiconductor device 100 having a heterostructure channel layer, in accordance with some embodiments. Semiconductor device 100 can have finFETs 102A-102C. FIG. 2 illustrates a zoomed-in cross-sectional view of area 105 along line A-A of semiconductor device 100 having heterostructure channel layer 108B, in accordance with some embodiments. FIG. 3 illustrates an isometric view of heterostructure channel layer 108B, in accordance with some embodiments. FIG. 4 illustrates an isometric view of another heterostructure channel layer 108B*, in accordance with some embodiments. Referring to FIGS. 1-4, semiconductor device 100 having finFETs 102A-102C can be formed on a substrate 104 and can include fin structure 108, shallow trench isolation (STI) regions 106, source/drain (S/D) structures 110, gate structures 112, gate spacers 114, etch stop layer (ESL) 116, and interlayer dielectric (ILD) layer 118.

In some embodiments, finFETs 102A-102C can be all n-type finFETs (NFETs). In some embodiments, finFET 102A can be an NFET and have n-type S/D structures 110. FinFET 102B can be a p-type finFET (PFET) and have p-type S/D structures 110. FinFET 102C can be an NFET and have n-type S/D structures 110. In some embodiments, finFETs 102A-102C can be all PFETs. Though FIG. 1 shows three finFETs, semiconductor device 100 can have any number of finFETs. Though FIG. 1 shows one fin structure 108, semiconductor device 100 can have any number of fin structures similar to fin structure 108. In addition, semiconductor device 100 can be incorporated into an IC through the use of other structural components, such as contact structures, conductive vias, conductive lines, dielectric layers, passivation layers, and interconnects, which are not shown for simplicity. FIGS. 3 and 4 includes heterostructure channel layer 108lB/108B*, gate structures 112, and S/D) structures 110 for simplicity. The discussion of elements of finFETs 102A-102C with the same annotations applies to each other, unless mentioned otherwise. And like reference numerals generally indicate identical, functionally similar, and/or structurally similar elements.

Referring to FIGS. 1 and 2, substrate 104 can include a semiconductor material, such as silicon. In some embodiments, substrate 104 includes a crystalline silicon substrate (e.g., wafer). In some embodiments, substrate 104 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; and (iv) a combination thereof. Further, substrate 104 can be doped depending on design requirements (e.g., p-type substrate or n-type substrate). In some embodiments, substrate 104 can be doped with p-type dopants (e.g., boron, indium, aluminum, or gallium) or n-type dopants (e.g., phosphorus or arsenic).

STI regions 106 can provide electrical isolation to fin structure 108 from adjacent fin structures (not shown) and to semiconductor device 100 from neighboring structures (not shown) integrated with or deposited onto substrate 104. STI regions 106 can be made of a dielectric material. In some embodiments, STI regions 106 can include silicon oxide, silicon nitride, silicon oxynitride, fluorine-doped silicate glass (FSG), a low-k dielectric material, and/or other suitable insulating materials. In some embodiments, STI regions 106 can include a multi-layered structure. In some embodiments, semiconductor device 100 can further include isolation regions, such as local oxidation of silicon (LOCOS), deep trench isolation (DTI), buried oxide (BOX), and deep well formation.

Referring to FIGS. 1 and 2, fin structure 108 can be formed from patterned portions of substrate 104. Embodiments of the fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, forming patterns that have, for example, pitches smaller than what is otherwise obtainable using a single, direct photolithography process. For example, a sacrificial layer is formed over a substrate and patterned using a photolithography process. Spacers can be formed alongside the patterned sacrificial layer using a self-aligned process. The sacrificial layer is then removed, and the remaining spacers can then be used to pattern the fin structures.

As shown in FIGS. 1-4, fin structure 108 can be disposed underlying S/D structures 110 and gate structures 112 and can extend along an X-axis through gate structures 112. Fin structure 108 can be formed from a photolithographic patterning and an etching of substrate 104, In some embodiments, fin structure 108 can have a fin height 108H above substrate 104 along a Z-axis ranging from about 100 nm to about 300 nm. Though one fin structure 108 is shown in FIGS. 1-4, semiconductor device 100 can have any number of fin structures 108. Fin structure 108 can include a fin bottom layer 108A on substrate 104 and a heterostructure channel layer 108B on fin bottom layer 108A. In some embodiments, fin bottom layer 108A can include a material similar to substrate 104. In some embodiments, fin bottom layer 108A can include silicon. In some embodiments, fin bottom layer 108A can include silicon germanium. The semiconductor materials of fin bottom layer 108A can be undoped or can be doped as substrate 104.

In FIGS. 1-4, heterostructure channel layer 108B under gate structures 112 can form channel regions of semiconductor device 100 and represent current carrying structures of semiconductor device 100. In some embodiments, as shown in FIGS. 2 and 3, heterostructure channel layer 108B can include five portions 108B1, 108B2, 108B3, 108B4, and 108B5. Portions 108B2 and 108B4 can include a material different from portions 108B1, 108B3, and 108B5 to increase the energy barrier between S/D structures 110 on opposite ends of heterostructure channel layer 108B and reduce the off-state leakage current of finFET 102B. In some embodiments, an energy barrier between portions 108B2 and 108B3 or between portions 108B4 and 108B5 can range from about 0.1 eV to about 1 eV. If the energy barrier is less than about 0.1 eV, heterostructure channel layer 108B may not reduce the off-state leakage current of finFET 102B. If the energy barrier is greater than about 1 eV, heterostructure channel layer 108B may significantly reduce the on-state current of finFET 102B and degrade its device performance.

In some embodiments, portions 108B1, 108B3, and 108B5 can include the same semiconductor material as fin bottom layer 108A. Portions 1082 and 108B4 can include a semiconductor material different from fin bottom layer 108A. Different semiconductor materials in portions 108B1-108B5 can form heterojunctions between portions 108B1, 108B2, 108B3, 108B4, and 108B5. The heterojunctions can increase energy barriers between different portions of heterostructure channel layer 108B and reduce the off-state leakage current in heterostructure channel layer 108. From example, fin bottom layer 108A and portions 1081I, 108B3, and 108B5 can include silicon and portions 108B2 and 108B4 can include silicon germanium or other suitable materials. In some embodiments, a germanium concentration of the silicon germanium in portions 108B2 and 108B4 can range from about 5 atomic percent to about 40 atomic percent. If the germanium concentration is less than about 5 atomic percent, heterostructure channel layer 108B may not reduce the off-state leakage current of finFET 102B. If the germanium concentration is greater than about 40 atomic percent, heterostructure channel layer 108B may significantly reduce the on-state current of finFET 102B and degrade its device performance.

In some embodiments, portions 108B2 and 108B4 can include the same semiconductor material as fin bottom layer 108A but can be doped with a dopant different from fin bottom layer 108A, Different dopants in portions 108B1-108B5 can form heterojunctions between portions 108B1, 108B2, 108B3, 108B4, and 108B5. The heterojunctions can increase energy barriers between different portions of heterostructure channel layer 108B and reduce the off-state leakage current in heterostructure channel layer 108B. For example, fin bottom layer 108A and portions 108B1, 108B3, and 108B5 can include silicon and can be doped with an n-type dopant, such as phosphorus (P) and arsenic (As). Portions 108B2 and 108B4 can also include silicon but can be doped with a p-type dopant, such as boron (B), indium (In), and gallium (Ga).

In some embodiments, portions 108B1, 108B3, and 108B5 can include a semiconductor material having a first crystal orientation. Portions 108B2 and 108B4 can include a semiconductor material having a second crystal orientation different from the first crystal orientation. Different crystal orientations of semiconductor materials can form heterojunctions in portions 108B1, 108B2, 108B3, 108B4, and 108B5. The heterojunctions can increase energy barriers between different portions of heterostructure channel layer 108B and reduce the off-state leakage current in heterostructure channel layer 108B. For example, fin bottom layer 108A and portions 108B1, 108B3, and 108B5 can include silicon having a crystal orientation of <110>. Portions 108B2 and 108B4 can also include silicon germanium having a crystal orientation of <111>.

In some embodiments, portions 108B1, 108B3, and 108B5 can include the same semiconductor material and the same dopant as fin bottom layer 108A. Portions 108B2 and 108B4 can include a semiconductor material different from fin bottom layer 108A and a dopant different from fin bottom layer 108A. Different semiconductor materials and different dopants can further increase the energy barriers and further reduce the off-state leakage current in heterostructure channel layer 108B. For example, fin bottom layer 108A and portions 108B1, 108B3, and 108B5 can include silicon and can be doped with an n-type dopant. Portions 108B2 and 108B4 can include silicon germanium and can be doped with a p-type dopant.

In some embodiments, portions 108B1, 108B3, and 108B5 can include the same semiconductor material and the same dopant as fin bottom layer 108A. Portions 108B2 and 108B4 can include a semiconductor material different from fin bottom layer 108A and a dopant different from fin bottom layer 108A. Additionally, portions 108B2 and 108B4 can include a semiconductor material different from each other and/or a dopant concentration different from each other. Different semiconductor materials and/or different dopant concentrations can further increase the energy barriers and reduce the off-state leakage current in heterostructure channel layer 108B. For example, fin bottom layer 108A and portions 108B1, 108B3, and 108B5 can include silicon and can be doped with an n-type dopant. Portion 108B2 can include silicon germanium with a germanium concentration from about 5 atomic percent to about 25 atomic percent, Portion 108B4 can include silicon germanium with a germanium concentration from about 25 atomic percent to about 40 atomic percent. In some embodiments, portion 108B2 can include silicon germanium doped with B at a concentration from about $1 \times 10^{15}$ to about $5 \times 10^{18}$ atoms/cm$^3$, and portion 108B4 can include silicon germanium doped with 13 at a concentration from about $1 \times 10^{17}$ to about $5 \times 10^{20}$ atoms/cm$^3$. A ratio of the B concentration in portion 108B2 to the B concentration in portion 108B4 can range from about 1 to about 1000.

As shown in FIGS. 2-3, heterostructure channel layer 108B can have a height 108CH along a Z-axis above STI regions 106 ranging from about 30 nm to about 80 nm. In some embodiments, a ratio of height 108CH to height 108H can range from about 0.1 to about 0.8. Portions 108B1, 108B2, 108B3, 108B4, and 108B5 can have widths 108B1$w$, 108B2$w$, 108B3$w$, 108B4$w$, and 108B5$w$ along an X-axis, each ranging from about 2 nm to about 6 nm. In some embodiments, a ratio of width 108B1$w$ to width 108B2$w$ or width 108B3$w$ to width 108B4$w$ can range from about 0.8 to about 1.2 to improve process control of forming portions 108B2 and 108B4. In some embodiments, portions 108B1, 108B2, 108B3, 108B4, and 108B5 can have the substantially same width. In some embodiments, heterostructure channel layer 108B with five or more portions can be used for semiconductor devices manufactured based on various technology nodes, such as 7 nm, 14 nm, and 20 nm technology nodes. Though FIGS. 1-4 show five regions in heterostructure channel layer 108, heterostructure channel layer 108B can have any number of regions to increase the energy barrier across heterostructure channel layer 108B and reduce the off-state leakage current in heterostructure channel layer 108B.

In some embodiments, as shown in FIG. 4, heterostructure channel layer 108B* can include three portions 108B1*, 108B2*, and 108B3*. Portion 108B2* can include a material different from portions 108B1* and 108B3* to increase the energy barrier between S/D structures 110 on opposite ends of heterostructure channel layer 108B* and reduce the off-state leakage current in heterostructure channel layer 108B*. In some embodiments, the material difference in portions 108B1*, 108B2*, and 108B3* in heterostructure channel layer 108B* can be similar to the material difference in portions 108B1, 108B2, 108B3, 108B4, and 108B5 in heterostructure channel layer 108 as described above. As shown in FIG. 4, portions 108B1*, 108B2*, and 108B3* can have widths 108B1*$w$, 108B2*$w$, and 108B3*$w$ along an X-axis ranging from about 3 nm to about 10 nm. In some embodiments, a ratio of width 108B1*w or 108B3*w to width 108B2*w can range from about 0.8 to about 1.2 to improve process control of forming portions 108B2*. In some embodiments, portions 108B1*, 108B2*, 108B3* can have the substantially same width. In some embodiments, heterostructure channel layer 108B* with three portions can be used for semiconductor devices manufactured based on different technology nodes, such as 5 nm and 3 nm technology nodes.

Referring to FIGS. 1-4, S/D structures 110 can be disposed on opposing sides of gate structures 112 and function as S/D regions of semiconductor device 100. As shown in FIG. 2, S/D structures 110 can be disposed on fin bottom layer 108A and in contact with opposite ends of heterostructure channel layer 108B. In some embodiments, S/D structures 110 can have any geometric shape, such as a polygon, an ellipsis, and a circle. In some embodiments, S/D structures 110 can include an epitaxially-grown semiconductor material the same as the material of fin bottom layer 108A. In some embodiments, the epitaxially-grown semiconductor material can include a material different from the material of fin bottom layer 108A and imparts a strain on the channel regions under gate structures 112. Since the lattice constant of such epitaxially-grown semiconductor material is different from the material of substrate 104, the channel regions are strained to advantageously increase carrier mobility in the channel regions of semiconductor device 100. The epitaxially-grown semiconductor material can include: (i) a semiconductor material, such as germanium and silicon; (ii) a compound semiconductor material, such as gallium arsenide and aluminum gallium arsenide; or (iii) a semiconductor alloy, such as silicon germanium and gallium arsenide phosphide.

In some embodiments, S/D structures 110 can include silicon and can be in-situ doped during an epitaxial growth process using n-type dopants, such as P and As. In some embodiments, S/D structures 110 can include silicon, silicon germanium, germanium, or III-V materials (e.g., indium antimonide, gallium antimonide, or indium gallium antimonide) and can be in-situ doped during an epitaxial growth process using p-type dopants, such as B, In, and Ga. In some embodiments, S/D structures 110 can include one or more epitaxial layers and each epitaxial layer can have different compositions.

Referring to FIGS. 1-4, gate structures 112 can be multi-layered structures and can be disposed around heterostructure channel layer 108IB. As shown in FIG. 2, each of gate structures 112 can include a gate dielectric layer 215 and a metal gate 217. Gate dielectric layer 215 can include an interfacial layer and a high-k gate dielectric layer. The term "high-k" can refer to a high dielectric constant. In the field of semiconductor device structures and manufacturing processes, high-k can refer to a dielectric constant that is greater than the dielectric constant of $SiO_2$ (e.g., greater than about 3.9). In some embodiments, the interfacial layer can include silicon oxide. In some embodiments, the high-k gate dielectric layer can include hafnium oxide ($HfO_2$), zirconium oxide ($ZrO_2$), and other suitable high-k dielectric materials.

In some embodiments, metal gate 217 can include a work-function layer and a gate electrode. The work-function layer can include work-function metals to tune threshold voltages ($V_t$) of finFETs 102A-102C. In some embodiments, the work-function layer can include titanium nitride, ruthenium, titanium aluminum, titanium aluminum carbon, tantalum aluminum, tantalum aluminum carbon, or other suitable work-function metals. In some embodiments, the work-function layer can include a single metal layer or a stack of metal layers. The stack of metal layers can include work-function metals having work-function values equal to or different from each other. The gate electrode can include titanium, tantalum, aluminum, cobalt, tungsten, nickel, ruthenium, and other suitable conductive materials. In some embodiments, gate structures 112 can have a width 112W along a Y-axis ranging from about 5 nm to 30 nm.

Referring to FIGS. 1 and 2, gate spacers 114 can be disposed on sidewalls of gate structures 112, according to some embodiments. Gate spacers 114 can include insulating materials, such as silicon oxide, silicon nitride, silicon oxynitride, silicon carbonitride, silicon oxycarbide, silicon oxycarbonitride, a low-k material, and a combination thereof. Gate spacers 114 can include a single layer or a stack of insulating layers. Gate spacers 114 can have a low-k material with a dielectric constant less than about 3.9 (e.g., about 3.5, about 3.0, or about 2.8).

ESL 116 can be disposed on STI regions 106, S/D structures 110, and sidewalls of gate spacers 114. ESL 116 can be configured to protect STI regions 106, S/D structures 110, and gate structures 112 during the formation of S/D contact structures on S/D structures 110. In some embodiments, ESL 116 can include a dielectric material, such as silicon oxide, silicon nitride, silicon oxynitride, silicon carbide, silicon carbonitride, boron nitride, silicon boron nitride, silicon carbon boron nitride, and a combination thereof.

Figure 5:
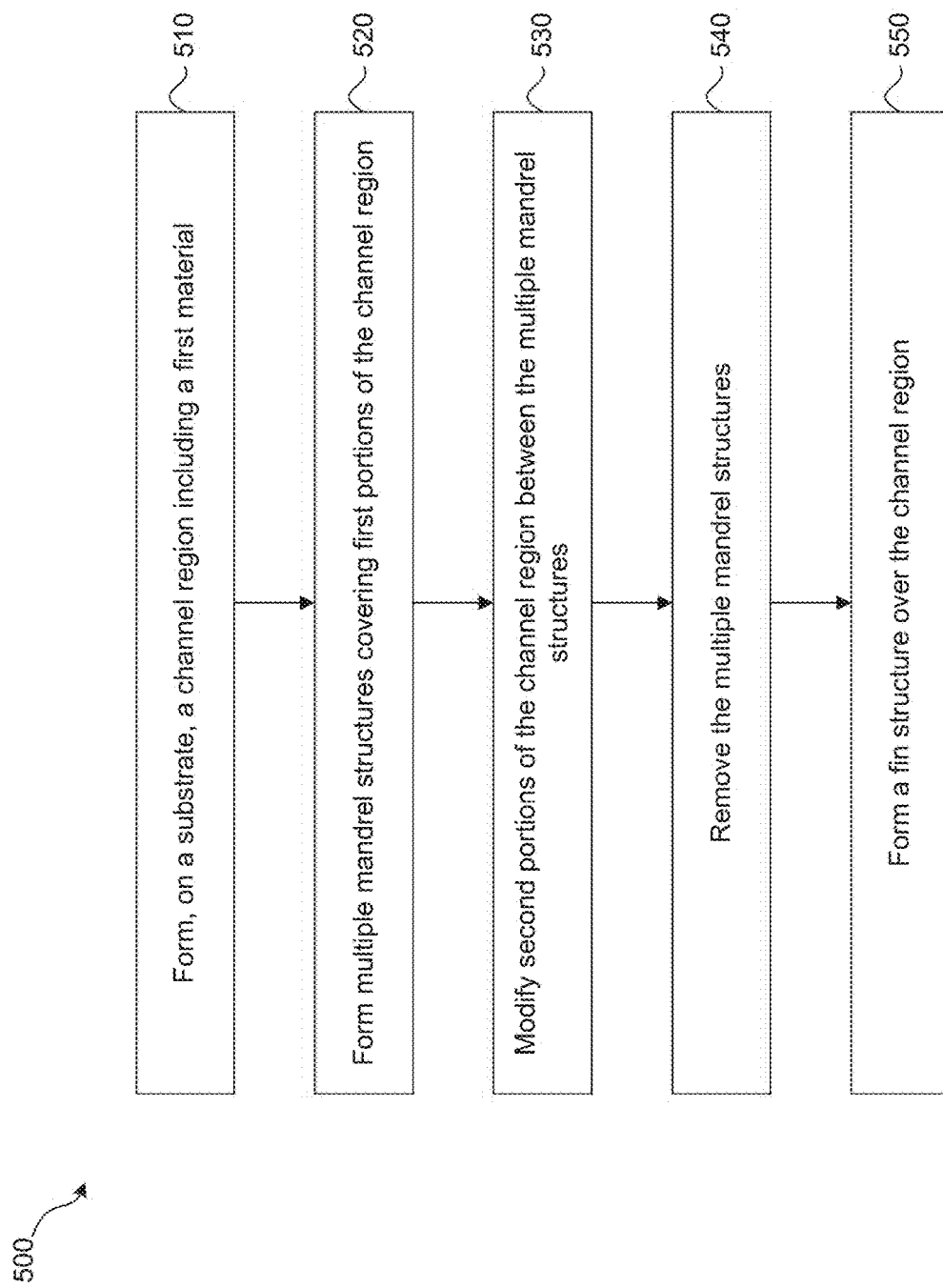
FIG. 5 is a flow diagram of a method for fabricating a semiconductor device having a heterostructure channel layer, in accordance with some embodiments.

ILD layer 118 can be disposed on ESL 116 over S/D structures 110 and STI regions 106. ILD layer 118 can include a dielectric material deposited using a deposition method suitable for flowable dielectric materials. For example, flowable silicon oxide can be deposited using flowable chemical vapor deposition (FCVD). In some embodiments, the dielectric material can include silicon oxide, FIG. 5 is a flow diagram of a method 500 for fabricating semiconductor device 100 having heterostructure channel layer 108B, in accordance with some embodiments. Method 500 may not be limited to finFET devices and can be applicable to devices that would benefit from heterostructure channel layers, such as planar FETs, GAA FETs, silicon-on-insulator (SOI) devices, high-voltage (1-V) devices, Bipolar-CMOS-DMOS (BCD) devices, and other semiconductor devices. Additional fabrication operations may be performed between various operations of method 500 and may be omitted merely for clarity and ease of description. Additional processes can be provided before, during, and/or after method 500; one or more of these additional processes are briefly described herein. Moreover, not all operations may be needed to perform the disclosure provided herein. Additionally, some of the operations may be performed simultaneously or in a different order than shown in FIG. 5. In some embodiments, one or more other operations may be performed in addition to or in place of the presently described operations.

For illustrative purposes, the operations illustrated in FIG. 5 will be described with reference to the example fabrication process for fabricating semiconductor device 100 as illustrated in FIGS. 6-16. FIGS. 6-16 illustrate partial isometric views of semiconductor device 100 having heterostructure channel layer 108B at various stages of its fabrication, in accordance with some embodiments. Elements in FIGS. 6-16 with the same annotations as elements in FIGS. 1-3 are described above.

Figure 6:
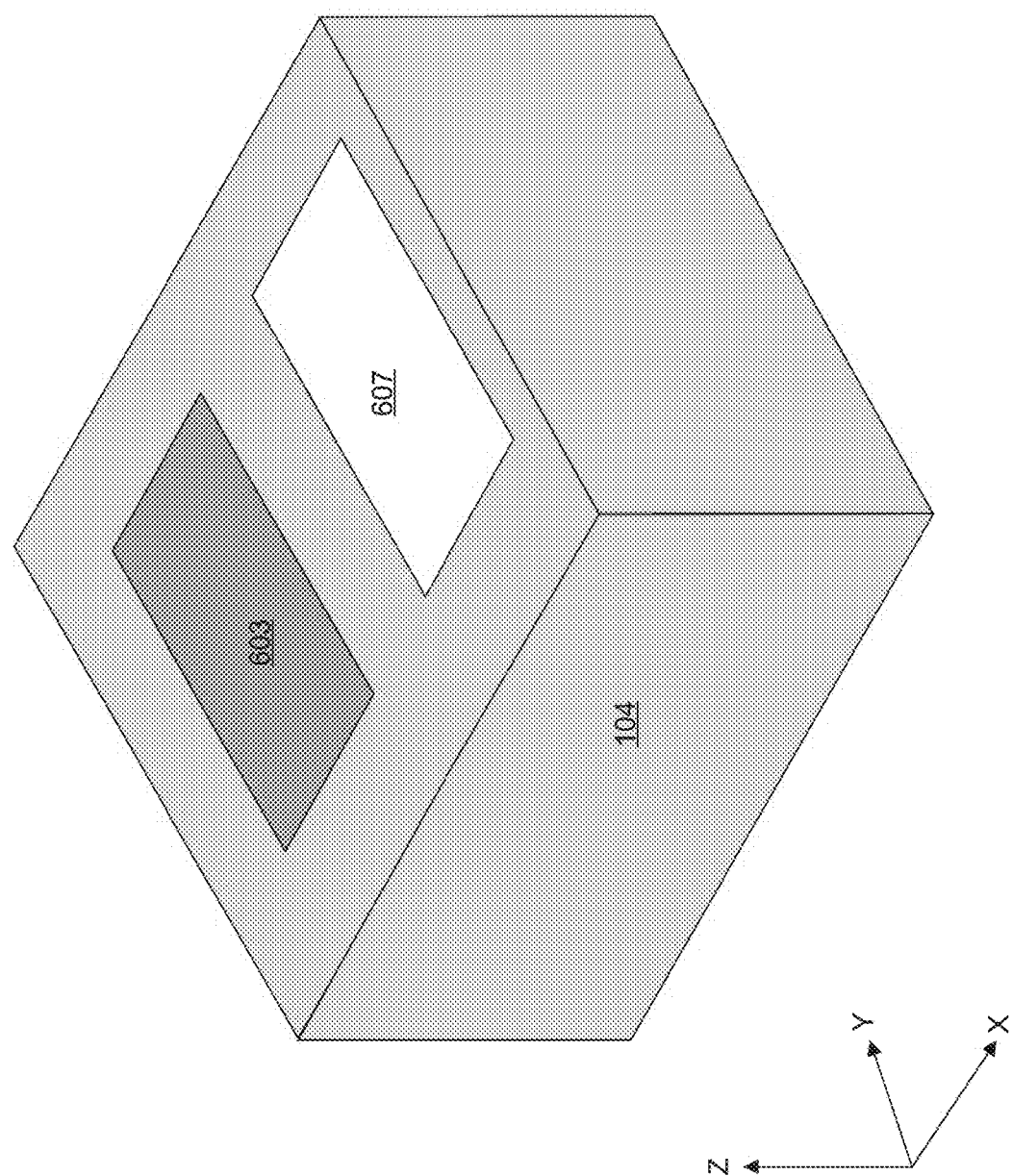
FIGS. 6-12 illustrate isometric views of a semiconductor device having a heterostructure channel layer at various stages of its fabrication, in accordance with some embodiments.

In referring to FIG. 5, method 500 begins with operation 510 and the process of forming, on a substrate, a channel region including a first material. For example, as shown in FIG. 6, channel regions 603 and 607 can be formed on substrate 104. In some embodiments, channel region 603 can be an n-channel region by patterning and doping substrate 104 with a p-type dopant. In some embodiments, channel region 607 can be a p-channel region by patterning and doping substrate 104 with an n-type dopant. In some embodiments, substrate 104 and channel regions 603 and 607 can include a semiconductor material, such as silicon. In some embodiments, substrate 104 and channel regions 603 and 607 can include a semiconductor layer on at least the surface portion. For example, substrate 104 can include silicon, and channel regions 603 and/or 607 can include silicon germanium around their surface portion. In some embodiments, channel regions 603 and 607 can have a depth ranging from about 100 nm to about 300 nm.

Figure 7:
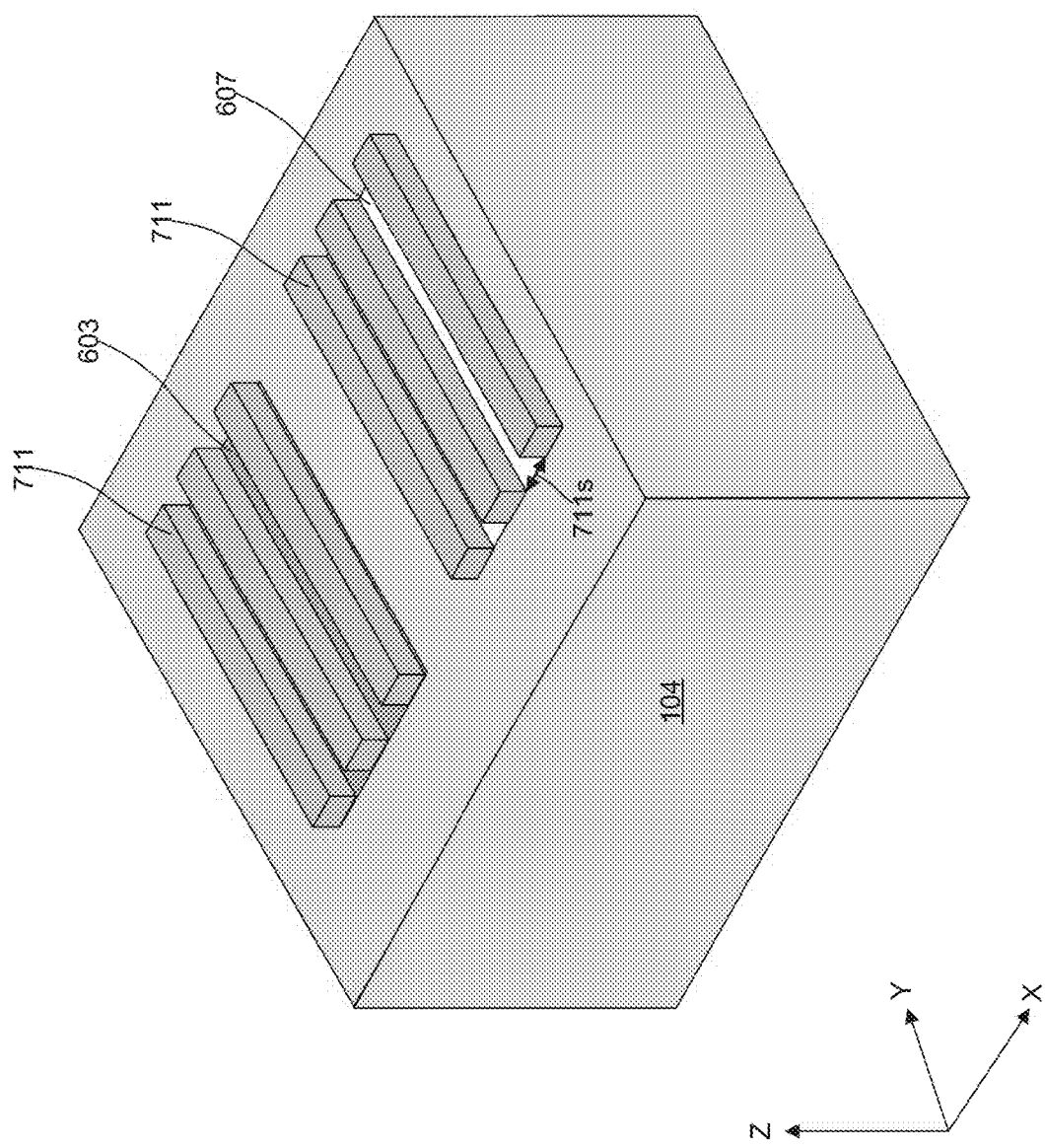

Referring to FIG. 5, in operation 520, multiple mandrel structures are formed covering first portions of the channel region. For example, as shown in FIG. 7, mandrel structures 711 can be formed on channel regions 603 and 607. Mandrel structures 711 can cover portions of channel regions 603 and 607. In some embodiments, a hard mask layer can be formed on substrate 104 and patterned and etched to form mandrel structures 711. In some embodiments, the hard mask layer can include a photoresist, amorphous silicon, silicon oxide, silicon nitride, or other suitable materials. The patterning process can include blanket depositing the hard mask layer on substrate 104 over channel regions 603 and 607, exposing the photoresist to a pattern, performing post-exposure bake processes, and developing the photoresist to form a masking element including the photoresist. The masking element can be used to protect regions of the hard mask layer while one or more etching processes sequentially removes exposed hard mask layer. After etching, mandrel structures 711 can be patterned on channel regions 603 and 607. In some embodiments, mandrel structures 711 can have spacing 711s between adjacent mandrel structures along an X-axis ranging from about 2 nm to about 6 nm.

Figure 8:
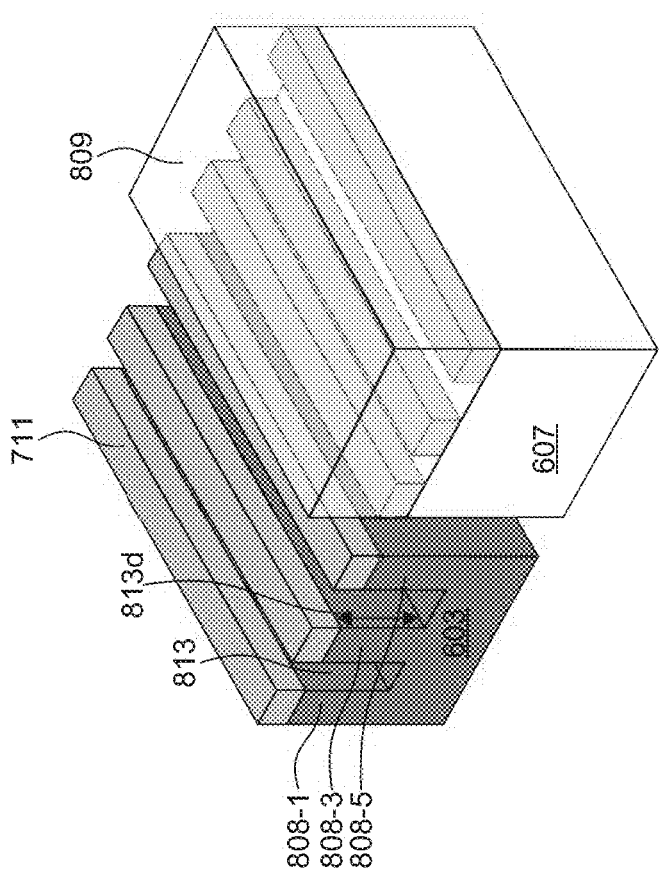
Figure 9:
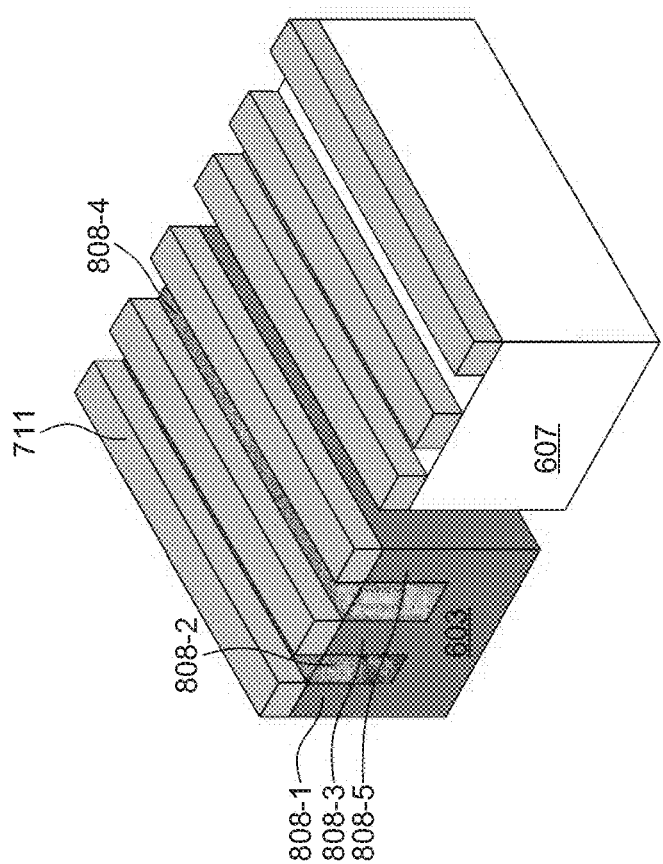
Figure 10:
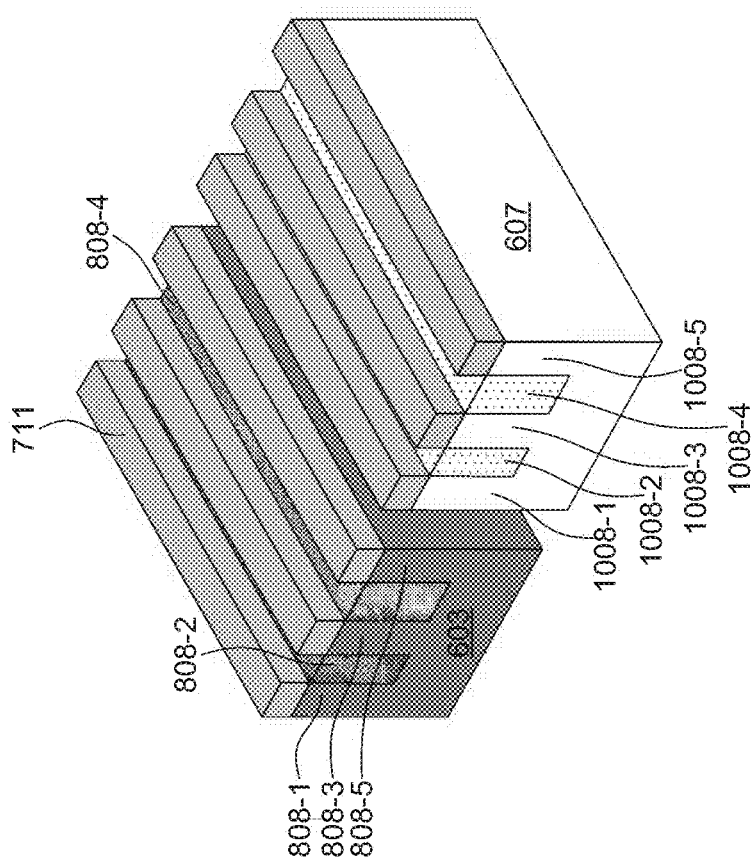

Referring to FIG. 5, in operation 530, second portions of the channel region between the multiple mandrel structures are modified. For example, as shown in FIGS. 8-10, channel regions 603 and 607 between mandrel structures 711 can be modified to include a material different from channel regions 603 and 607 under mandrel structures 711. In some embodiments, as shown in FIG. 8, a photo layer 809 can be formed on channel regions 603 and 607 and patterned to cover channel region 607. Channel region 603 between mandrel structures 711 can be etched to form openings 813. After etching, portions 808-1, 808-3, and 808-5 can be formed under mandrel structures 711. In some embodiments, openings 813 can have a depth 813d along a Z-axis ranging from about 30 nm to about 80 nm.

The formation of openings 813 between mandrel structures 711 on channel region 603 can be followed by formation of portions 808-2 and 808-4 in openings 813. For example, as shown in FIG. 9, portions 808-2 and 808-4 can be formed in openings 813. In some embodiments, portions 808-2 and 808-4 can be epitaxial structures and can be selectively grown on channel region 603 in openings 813 by atomic layer deposition (ALD), chemical vapor deposition (CVD), or other suitable deposition methods. In some embodiments, the ALD process can be performed at a temperature from about 150° C. to about 400° C. under a pressure from about 3 torr to about 760 torr. In some embodiments, portions 808-2 and 808-4 can be in-situ doped during the epitaxial growth process. For example, channel region 603 can include silicon and can be an n-channel region doped with a p-type dopant. The epitaxial growth of portions 808-2 and 808-4 can include precursors, such as dichlorosilane (DCS) or silane ($SiH_4$) as a silicon precursor and germane as a germanium precursor. In some embodiments, the epitaxial growth of portions 808-2 and 808-4 can include precursors, such as dichlorosilane (DCS) or silane ($SiH_4$) as a Si precursor and phosphine or arsine as an n-type dopant precursor. The epitaxially grown portions 808-2 and 808-4 can form heterojunctions in portions 808-1, 808-2, 808-3, 808-4, and 808-5 and increase energy barriers across these portions.

In some embodiments, channel region 603 between mandrel structures 711 may not be removed and can be doped to include a dopant different from channel region 603 under mandrel structures 711. For example, a doping process can be performed on channel region 603 by implanting a dopant in channel region 603 between mandrel structures 711. In some embodiments, the doping process can be performed by diffusing a dopant to channel region 603 between mandrel structures 711. Mandrel structures 711 can block the dopant from entering channel region 603 under mandrel structures 711. In some embodiments, the doping process can include dopant materials, such as titanium oxide, gallium arsenide, indium phosphide, gallium phosphide, tantalum oxynitride, zirconium oxide, silicon carbide, strontium titanium oxide, tungsten oxide, zinc sulfide, and cadmium selenide. In some embodiments, the implant process can have an implant energy ranging from about 0.5 keV to about 60 keV and a dose range from about $10^5$ $cm^{-2}$ to about 1016 $cm^{-2}$ The implant angle can range from about normal to about 60 degrees from normal (e.g., along a Z-axis). In some embodiments, the diffusion process can be performed under a temperature ranging from about 150° C. to about 800° C. with a diffusion time from about 5 seconds to about 1 hour. In some embodiments, channel region 603 between mandrel structures 711 can be doped with a type of dopant opposite to the dopant in channel region 603 under mandrel structures 711. For example, channel region 603 can be an n-channel region doped with a p-type dopant. The doping process can dope an n-type dopant in channel region 603 between mandrel structures 711 to form portions 808-2 and 808-4. The doped portions 808-2 and 808-4 can form heterojunctions in portions 808-1, 808-2, 808-3, 808-4, and 808-5 and increase energy barriers across these portions.

The formation of portions 808-2 and 808-4 on channel region 603 can be followed by formation of portions 1008-2 and 1008-4 on channel region 607, as shown in FIGS. 9 and 10. Photo layer 809 can be removed after the formation of portions 808-2 and 808-4. Similar to the formation of portions 808-2 and 808-4, channel region 603 can be covered by another photo layer. Channel region 607 between mandrel structures 711 can be modified by an epitaxial growth process or a doping process to form portions 1008-2 and 1008-4. Portions 1008-2 and 1008-4 can include a material different from portions 1008-1, 1008-3, and 1008-5 to form heterojunctions in portions 1008-1, 1008-2, 1008-3, 1008-4, and 1008-5.

Figure 11:
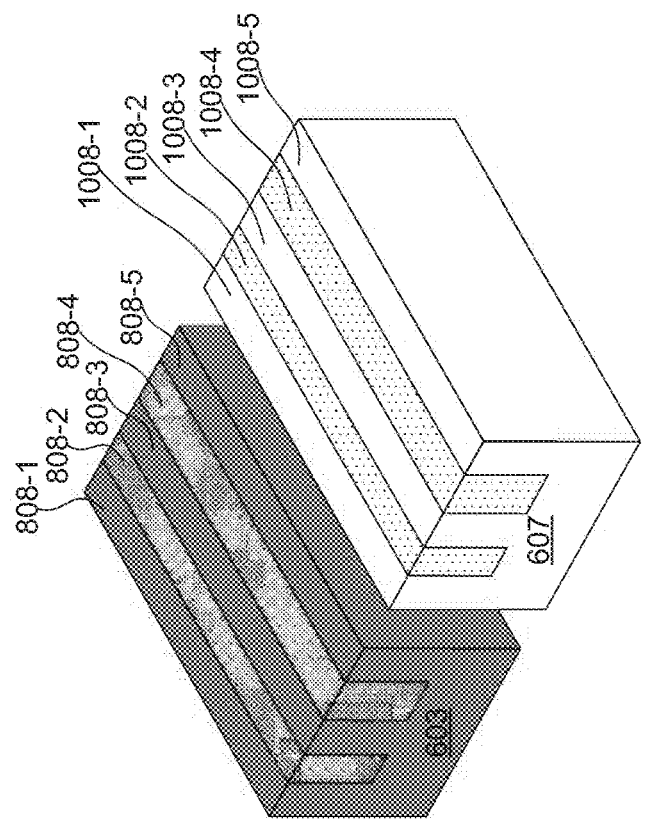

Referring to FIG. 5, in operation 540, the multiple mandrel structures are removed. For example, as shown in FIG. 11, mandrel structures 711 can be removed from channel regions 603 and 607 after formation of portions 1008-2 and 1008-4. In some embodiments, mandrel structures 711 can be removed by a chemical mechanical polishing (CMP) process. The CMP process can etch mandrel structures 711 and planarize top surfaces of channel regions 603 and 607.

Figure 12:
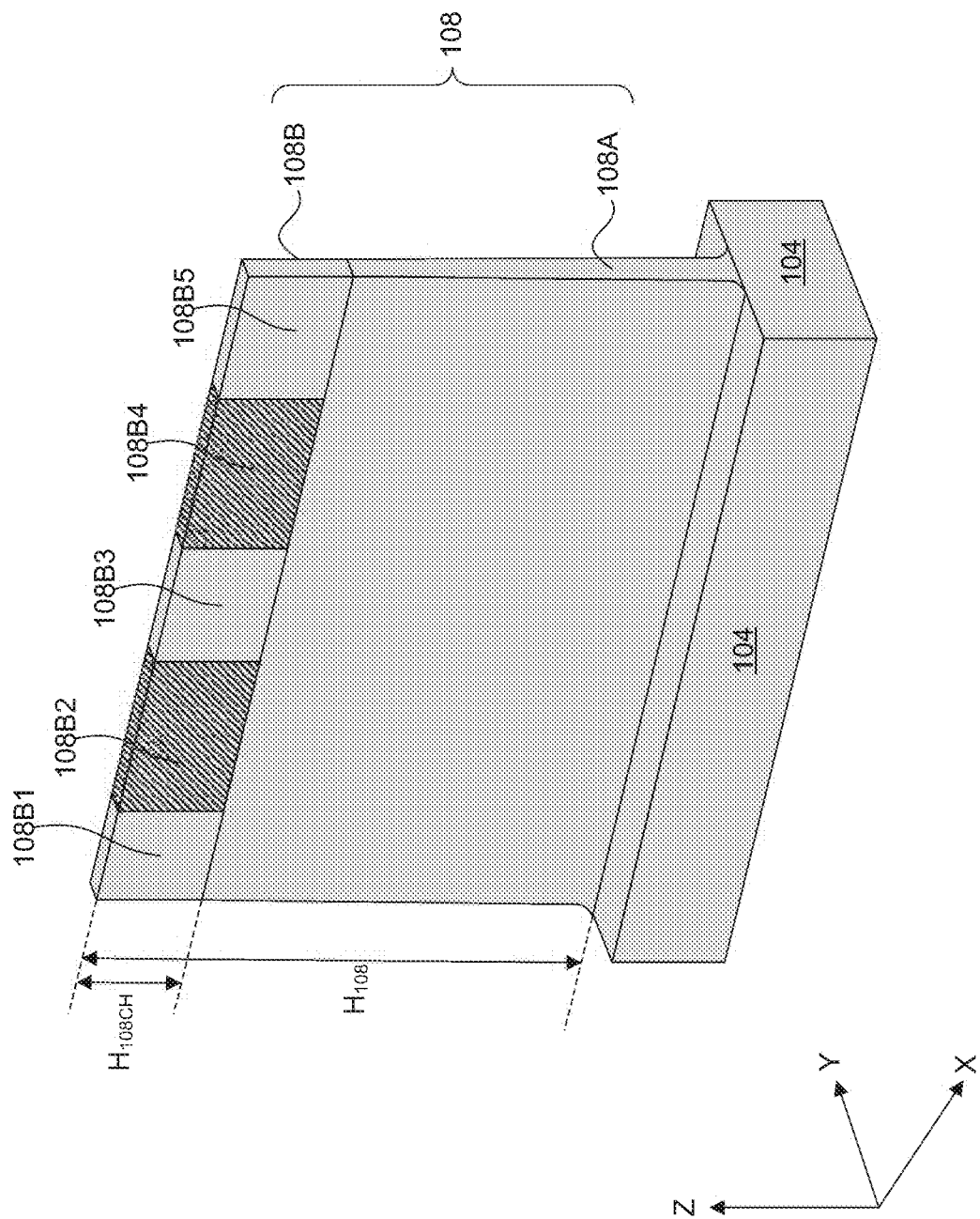
Figure 13:
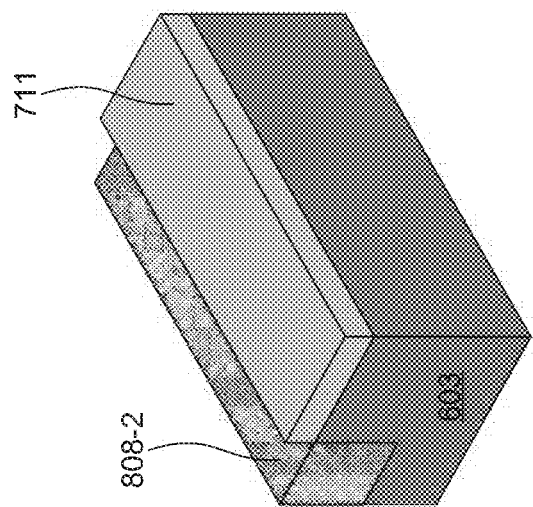

Referring to FIG. 5, in operation 550, a fin structure is formed over the channel region. For example, as shown in FIG. 12, fin structure 108 can be formed over channel regions 603 and 607. In some embodiments, portions 808-1, 808-2, 808-3, 808-4, and 808-5 in channel region 603 can form portions 108B1, 108B2, 108B3, 108B4, and 108B5 of heterostructure channel layer 108B. In some embodiments, portions 1008-1, 1008-2, 1008-3, 1008-4, and 1008-5 in channel region 607 can form portions 108B1, 108B2, 108B3, 108B4, and 108B5 of heterostructure channel layer 108B. In some embodiments, fin structure 108 can have a height 108H above substrate 104 along a Z-axis ranging from about 100 nm to about 300 mm. Heterostructure channel layer 108B can have a height 108CH along a Z-axis ranging from about 30 nm to about 80 nm.

With portions 108B2 and 108B4 having a material different from fin bottom layer 108A and portions 108B1, 108B3, and 108B5, heterostructure channel layer 108B can form heterojunctions in portions 108B1, 108B2, 108B3, 108B4, and 108B5. The heterojunctions can increase energy barriers between different portions of heterostructure channel layer 108B and reduce the off-state leakage current through heterostructure channel layer 108B, In some embodiments, the barrier height of the heterojunctions can range from about 0.1 eV to about 1 eV. In some embodiments, the off-state leakage current through heterostructure channel layer 108B can be reduced by about one to about four orders of magnitude. In some embodiments, the on-state current through heterostructure channel layer 108B can be reduced to about 0.7 to about 0.9 times of the on-state current of a channel layer without heterojunctions.

In some embodiments, portions 808-2 and 808-4 can have different materials from each other. For example, as shown in FIGS. 13-16, portion 808-2 can be formed first to include a material different from channel region 603. In some embodiments, channel region 603 can include silicon and portions 808-2 can include silicon germanium with a germanium concentration ranging from about 5 atomic percent to about 25 atomic percent. In some embodiments, channel region 603 can include silicon doped with a p-type dopant and portion 808-2 can include silicon doped with an n-type dopant from about $1\times10^{15}$ to about $5\times10^{18}$ atoms/cm$^3$.

Figure 14:
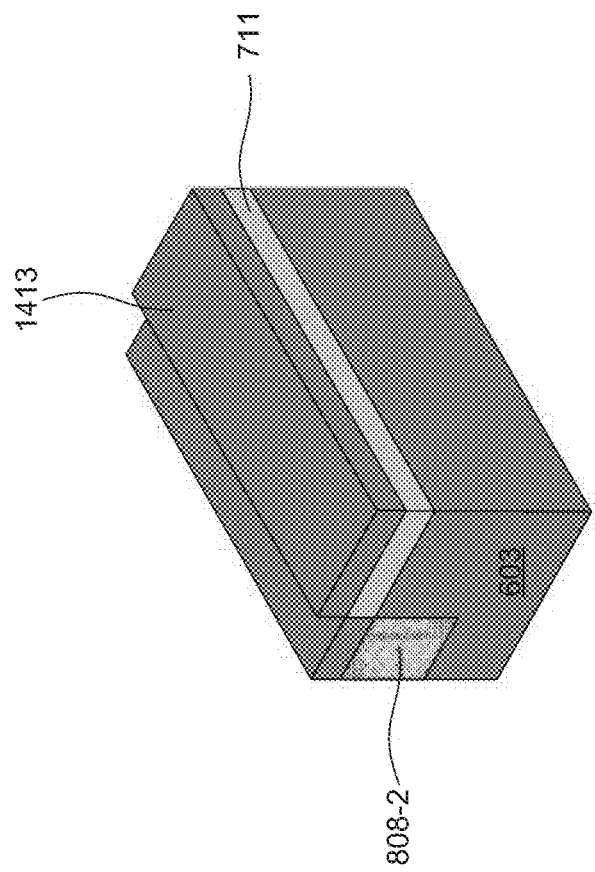
Figure 15:
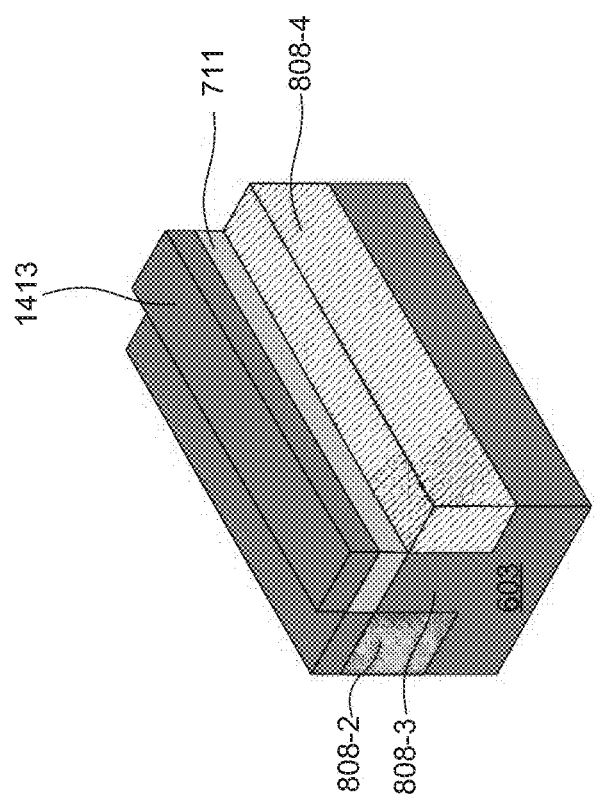

After formation of portion 808-2, as shown in FIG. 14, a capping layer 1413 can be blanket deposited on channel region 603 to cover 808-2. The capping layer 1413 can be patterned and etched to form portion 808-4, as shown in FIG. 15. In some embodiments, portion 808-4 can include silicon doped with an n-type dopant from about $1\times10^{17}$ to about $5\times10^{20}$ atoms/cm$^3$. In some embodiments, a ratio of the dopant concentration in portion 808-4 to the dopant concentration in portion 808-2 can range from about 1 to about 1000 to further recued the off-state leakage current through heterostructure channel layer 108B.

The formation of portion 808-4 can be followed by removal of capping layer 1413 and mandrel structures 711, as shown in FIG. 16. After the formation of fin structure 108, portions 808-2 and 808-4 having different materials can form different heterojunctions in heterostructure channel layer 108B, which can further increase the energy barriers and reduce the off-state leakage current in heterostructure channel layer 108B.

The formation of fin structure 108 can be followed by formation of S/D structures 110, formation of gate structures 112, formation of contact structures and interconnect structures, and other processes to form semiconductor device 100, which are not described in details for clarity.

Various embodiments of the present disclosure provide example methods for forming heterostructure channel layers 108B in semiconductor device 100 (e.g., finFETs, planar FETs, GAA FETs, and MOSFETs) and/or other semiconductor devices in an IC. The example methods in the present disclosure can form one or more heterojunctions in heterostructure channel layer 108B. The one or more heterojunctions in heterostructure channel layer 108E can increase the barrier height between the source and drain structures 110 of the semiconductor device 100 and reduce the off-state leakage current of semiconductor device 100. In some embodiments, one or more portions of heterostructure channel layer 108B can be doped with a dopant to form the heterojunctions. In some embodiments, one or more portions of heterostructure channel layer 108B can be removed and deposited with a material different from heterostructure channel layer 108B to form the heterojunctions. In some embodiments, one or more portions of heterostructure channel layer 108B can be removed and deposited with a material different from the channel layer and doped with a dopant to form the heterojunctions. In some embodiments, the dopant concentrations in the one or more portions can be different from each other to further reduce the off-state leakage current. In some embodiments, a barrier height of the one or more heterojunctions can range from about 0.1 eV to about 1 eV to reduce the off-state leakage current by about one to about four orders of magnitude.

In some embodiments, a semiconductor structure includes a substrate and a fin structure on the substrate. The fin structure includes a channel layer and a bottom layer between the channel layer and the substrate. The channel layer includes first, second, and third portions on top of the bottom layer. The second portion is between the first and third portions. The first and third portions include the same material as the bottom layer. The second portion includes a material different from the bottom layer. The semiconductor structure further includes first and second source/drain structures on the bottom layer and adjacent to the channel layer. The first source/drain structure is in contact with the first portion of the channel layer. The second source/drain structure is in contact with the third portion of the channel layer.

In some embodiments, a semiconductor structure includes a substrate and a fin structure on the substrate. The fin structure includes a channel layer and a bottom layer between the channel layer and the substrate. The channel layer includes first, second, third, and fourth portions in contact with the bottom layer. The first and third portions include the same material as the bottom layer. The second and fourth portions include a material different from the bottom layer. The semiconductor structure further includes a source/drain structure on the bottom layer and adjacent to an end of the channel layer. The source/drain structure is in contact with the first portion of the channel layer.

In some embodiments, a method includes forming, on a substrate, a channel region including a first material, forming multiple mandrel structures covering first portions of the channel region, and modifying second portions of the channel region between the multiple mandrel structures. The second portion includes a second material different from the first material. The method further includes removing the multiple mandrel structures and forming a fin structure over the channel region.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate;
a fin structure on the substrate, wherein:
the fin structure comprises a channel layer comprising silicon and a bottom layer between the channel layer and the substrate;
the channel layer comprises first, second, and third portions on top of the bottom layer;
the second portion is between the first and third portions;
the first and third portions comprise a same material as the bottom layer; and
the second portion comprises a material different from the bottom layer; and
first and second source/drain structures on the bottom layer and adjacent to the channel layer, wherein the first source/drain structure is in contact with the first portion of the channel layer, and wherein the second source/drain structure is in contact with the third portion of the channel layer.

2. The semiconductor structure of claim 1, wherein the second portion comprises a dopant different from that of the first portion.

3. The semiconductor structure of claim 1, wherein the second portion has a crystal orientation different from that of the first portion.

4. The semiconductor structure of claim 1, wherein the first portion comprises silicon and the second portion comprise silicon germanium.

5. The semiconductor structure of claim 1, wherein an energy barrier between the first and second portions ranges from about 0.1 eV to about 1 eV.

6. The semiconductor structure of claim 1, wherein the first portion has a first width and the second portion has a second width, and wherein a ratio of the first width to the second width ranges from about 0.8 to about 1.2.

7. The semiconductor structure of claim 1, wherein an energy barrier between the third and second portions ranges from about 0.1 eV to about 1 eV.

8. The semiconductor structure of claim 1, further comprising a gate structure around the channel layer.

9. A semiconductor device, comprising:
a channel region on a substrate, wherein:
the channel region comprises a bottom layer on the substrate and a channel layer on the bottom layer;
the channel layer comprises first, second, and third portions in contact with the bottom layer;
the first and third portions comprise a first material doped with a first dopant; and
the second portion comprises a second material different from the first material and doped with a second dopant different from the first dopant; and
a source/drain region on the bottom layer and adjacent to an end of the channel layer, wherein the source/drain region is in contact with the first portion of the channel layer.

10. The semiconductor device of claim 9, wherein the second dopant in the second portion is a p-type dopant, and wherein the first dopant in the first and third portions is an n-type dopant.

11. The semiconductor device of claim 9, wherein the second portion has a crystal orientation different from that of the first and third portions.

12. The semiconductor device of claim 9, further comprising an additional source/drain region on the bottom layer and in contact with the third portion of the channel layer.

13. The semiconductor device of claim 9, wherein an energy barrier between the first and second portions ranges from about 0.1 eV to about 1 eV.

14. The semiconductor device of claim 9, wherein the first portion has a first width and the second portion has a second width, and wherein a ratio of the first width to the second width ranges from about 0.8 to about 1.2.

15. The semiconductor device of claim 9, wherein the bottom layer and the substrate comprise the first material.

16. A semiconductor structure, comprising:
a bottom layer on a substrate;
a channel layer on the bottom layer, wherein:
the channel layer comprises first, second, and third portions in contact with the bottom layer;
first, second, and third portions have a substantially same width along a direction of the channel layer;
the first and third portions comprise a first material; and
the second portion comprises a second material different from the first material; and
a source/drain structure on the bottom layer and in contact with the first portion of the channel layer.

17. The semiconductor structure of claim 16, wherein the second portion comprises a p-type dopant and the first and third portions comprises an n-type dopant.

18. The semiconductor structure of claim 16, wherein the second portion has a crystal orientation of <111> and the first and third portions have a crystal orientation of <110>.

19. The semiconductor structure of claim 16, further comprising an additional source/drain structure on the bottom layer and in contact with the third portion of the channel layer.

20. The semiconductor structure of claim 16, wherein an energy barrier between the first and second portions ranges from about 0.1 eV to about 1 eV.

* * * * *